United States Patent [19]

Andrus

[11] Patent Number: 4,882,512
[45] Date of Patent: Nov. 21, 1989

[54] ELECTROMAGNETIC FORCE SENSOR
[75] Inventor: James H. Andrus, Glendale, Ariz.
[73] Assignee: Honeywell, Inc., Minneapolis, Minn.
[21] Appl. No.: 246,129
[22] Filed: Sep. 19, 1988
[51] Int. Cl.[4] .............................................. H02K 7/09
[52] U.S. Cl. .................................... 310/90.5; 318/632; 324/251; 324/260
[58] Field of Search .................. 310/12, 90.5; 324/251, 324/260; 318/632, 648

[56] References Cited

U.S. PATENT DOCUMENTS

| | | | |
|---|---|---|---|
| 4,629,262 | 12/1986 | Hamilton | 310/90.5 |
| 4,642,501 | 2/1987 | Kral et al. | 310/90.5 |
| 4,692,702 | 9/1987 | Hüschelrath et al. | 324/251 |
| 4,739,264 | 4/1988 | Kamiya et al. | |

Primary Examiner—Patrick R. Salce
Assistant Examiner—Judson H. Jones
Attorney, Agent, or Firm—Howard P. Terry

[57] ABSTRACT

An electromagnetic actuator having a sensor for sensing an amount of applied force is provided. The actuator maintains an adjustable force by adjusting a current in its coils. The actuator includes an armature and a stator. The stator has a U-shaped back iron, which has a first end portion with a first coil and which has a second end portion with a second coil. The coils form a magnetic flux path from the armature through the back iron and back to the armature. There is a flux density between the armature and each polar enlargement of the back iron. A first sensor unit is mounted on the first pole face, and a second sensor unit is mounted on the second pole face of the back iron, for sensing the flux densities. The first sensor includes a first Hall generator subassembly having a first input for receiving a reference voltage and having a first output for providing an output voltage. The second sensor includes a second Hall generator subassembly having a second input connected to the first output and having a second output for providing an output voltage, which is proportional to the square of the flux density, as sensed by the first and second Hall generator subassemblies. The output voltage is directly proportional to the force, which is proportional to the square of the flux density. Each Hall generator subassembly has a first amplifier, a Hall generator unit connected to the first amplifier, and a second amplifier connected to the Hall generator unit. Each Hall generator unit senses the flux density.

5 Claims, 2 Drawing Sheets

ELECTROMAGNETIC FORCE SENSOR

The invention generally relates to an electromagnetic force sensor; and in particular the invention relates to an electromagnetic force sensor having first and second cascaded Hall generator units.

This invention was made with United States Government support and the United States Government has certain rights therein.

BACKGROUND OF THE INVENTION

The prior art magnetic actuators are used in a variety of magnetic isolation, pointing and bearing suspension systems. These prior art actuators are used to apply an electromagnetic force to a body without physically contacting it. As current is applied through a stator coil, a force-producing flux is generated, which flows through a magnetic circuit. Ideally, a magnetic actuator would apply a known and repeatable force, for a commanded current level through the coil. In reality, however, there is an error or difference between the commanded and applied forces, which translates into system level errors. Minimizing this error is of paramount importance to precision pointing and isolation systems.

In the prior art actuators, different active control systems or devices have been employed to linearize the response of magnetic actuators. A few equations will be useful in describing some methods of controlling the magnetic armature force:

$$F = \frac{A}{u_o}(B^2). \quad \text{Equation 1}$$

F = electromagnetic force
A = cross-sectional area enclosed by the magnetic circuit
$u_o$ = permeability in a vacuum (approximately the same through air)
B = magnetic flux density $$B = \frac{u_o * N * I}{2 * g}. \quad \text{Equation 2}$$

N = number of coil turns
I = current through electromagnet coil
g = gap across magnetic interface
* = times Substituting equation 2 into equation 1 yields:

$$F = \frac{A * N^2 * u_o * I^2}{4 * g^2} = \frac{K * I^2}{g^2}. \quad \text{Equation 3}$$

From the equation above, force is proportional to the square of flux density, which in turn is proportional to the quotient of current and gap.

A first prior art magnetic actuator has a force control device, which is the most direct and accurate method of controlling the force applied to the armature, and which uses an accurate force measurement unit, such as a quartz force crystal, as the feedback element. Although very linear and accurate, this device requires the use of a relatively fragile sensor bridging the gap between the stator and armature interface. This requires that the sensor be protected during high acceleration, and also creates a spring mass mode, which limits the actuator bandwidth. This device is also the most expensive, and requires complex support electronics.

A second prior art magnetic actuator has a current-gap control device, which uses the relationship of equation 3 to control the magnetic actuator force. Proximeters measure the gas between stator and armature sections, and a current sensor measures the current through the magnetic actuator coil. Advantages of this device are the relative ease of implementation, and readily available sensors. The major disadvantage of this device stems from the fact that there are deviations from the ideal current-gap to flux relationship. A precision magnetic actuator, using current-gap control, requires a magnetic material with nearly a linear flux-current relationship. To attain this linearity, the magnetic material must exhibit low hysteresis, which requires careful and costly material processing. Also, a low-hysteresis material saturates at a relatively low flux density, necessitating a larger volume and weight actuator for a given force, relative to a high-hysteresis material.

A third prior art magnetic actuator has a flux control device with a flux sensor. Since force is proportional to flux squared (equation 1), a control loop using a flux sensor closes around hysteresis, actively controlling this nonlinearity. This device, uses high-hysteresis material, thereby reducing the cost and weight of the actuator. The disadvantage of this device is that it requires a more complicated sensor than the current-gap control device. Biasing techniques are used to operate a differential magnetic actuator within a linear operating region. The bias technique solves the problem associated with controlling a parameter proportional to flux squared with a sensor whose output is proportional to flux. The disadvantage of the bias technique, is that power must be dissipated through the actuator coils even when no differential force is required. To reduce the quiescent power of the device, a different controlling concept is used, taking the square root of the force command and delivering it as a flux control loop command. This requires a nonlinear element (analog multiplier) in an analog control system, or a square-rooting algorithm in a digital controller. An analog square-rooter reduces the overall accuracy of the actuator system, by the nonlinearity of the analog device. This problem is less of an issue with a digital controller, but does require additional computational lag to perform the square-rooting function.

SUMMARY OF THE INVENTION

According to the present invention, a magnetic actuator, which has a flux squared sensor, is provided. Functionally, the flux squared sensor offers the same control advantages as the flux control device. In addition, it provides a feedback signal proportional to force, enabling zero-bias operation without the requirement of a nonlinear circuit element or algorithm. This increases the actuator accuracy in an all-analog system, and reduces computational overhead in a digital or hybrid controller. The squaring of flux density is accomplished by cascading two Hall devices within a common magnetic field. The output of the first Hall device provides a flux modulated input of the second Hall device. Thus, an output voltage proportional to flux squared (and force according to equation 1), is provided utilizing linear circuit elements.

A horseshoe-type magnetic actuator includes an armature and a U-shaped stator having first and second end portions, the first end having a first coil, the second end having a second coil. A flux squared sensor, wherein said sensor has a first Hall unit and a cascaded second Hall unit, may be fabricated with both Hall units on either coil polar enlargement within the magnetic circuit, or one Hall unit on the first coil and the second on the second coil.

By using the flux squared sensor, there is provided an output voltage and current proportional to the force applied to the electromagnetic actuator without bridging the magnetic gap. The direct force measurement permits the actuator to operate directly in a low-quiescent power configuration, without utilizing nonlinear circuit elements or algorithms. The problems of the prior art magnetic actuators are avoided by this device.

The foregoing and other objects, features and advantages will be apparent from the following description of the preferred embodiment of the invention as illustrated in the accompanying drawings.

DESCRIPTION OF THE PREFERRED EMBODIMENT

Figure 1:
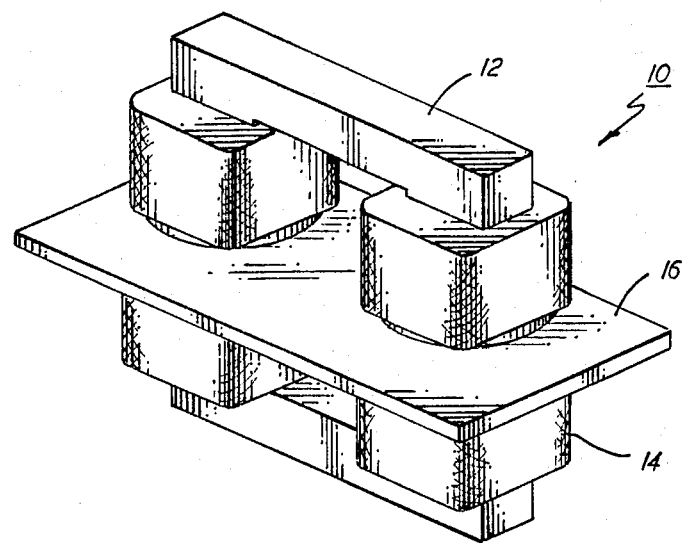
FIG. 1 is a perspective view of an electromagnetic actuator according to the invention.

As shown in FIG. 1, an electromagnetic actuator, or a magnetic actuator 10 is provided. Magnetic actuator 10 is a differential type of magnetic actuator. Actuator 10 includes a first top stator 12, a second bottom stator 14, and an armature 16.

Figure 2:
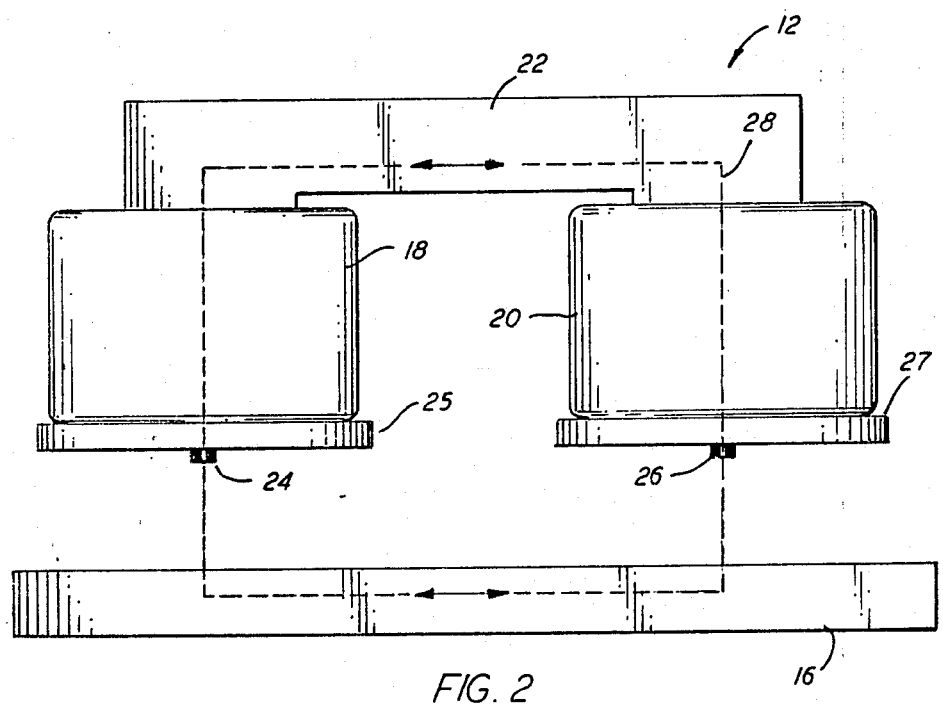
FIG. 2 is a partial elevation view of the electromagnetic actuator of FIG. 1.
Figure 3:
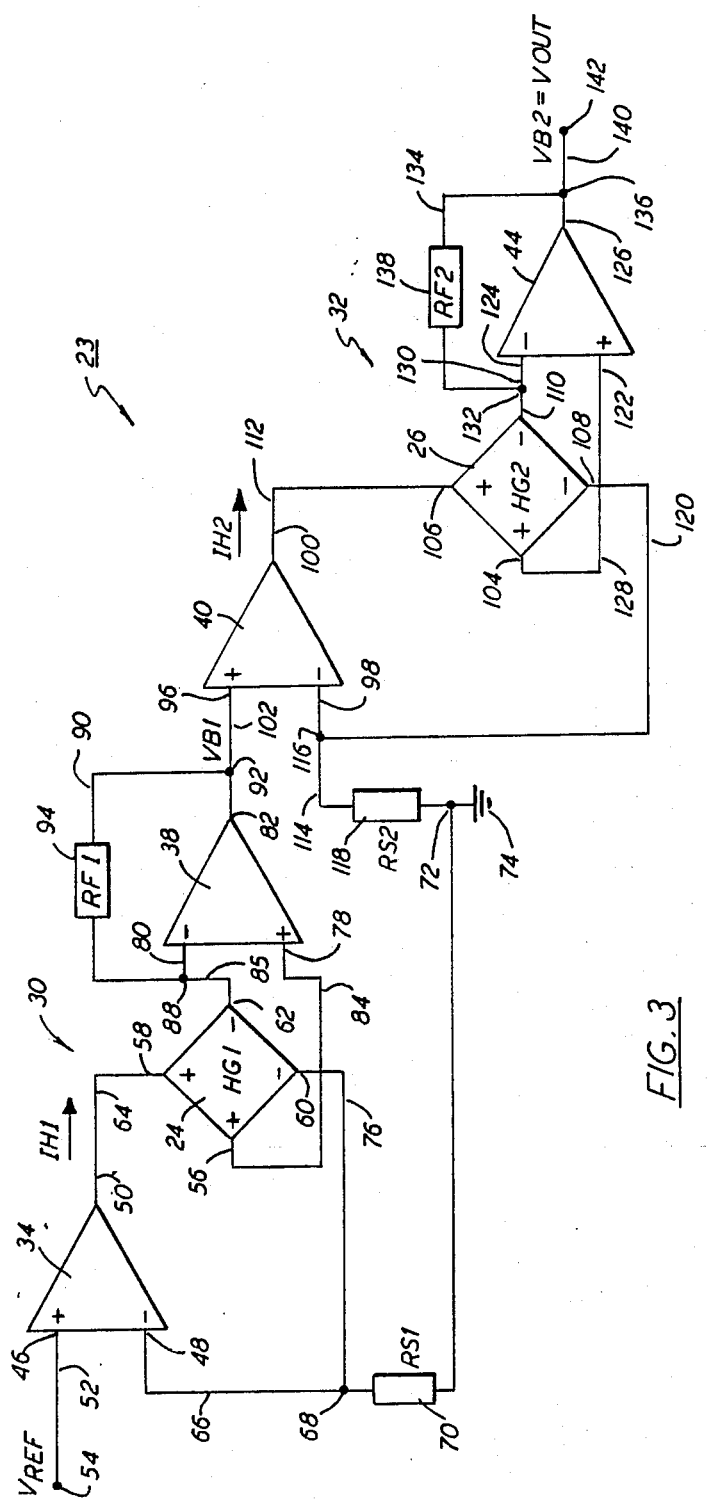
FIG. 3 is a functional block diagram of a portion of FIG. 2.

In FIGS. 2 and 3, top stator 12 is shown. Top stator 12 is identical in construction to bottom stator 14. Top stator 12 has a first left coil 18, a second right coil 20, and a stator back iron 22. Top stator 12 also has a flux squared sensor 23. Flux squared sensor 23 includes first left flux sensor 24 and a second right flux sensor 26 mounted on polar enlargements 25 and 27 respectively. Top stator 12 also has a magnetic flux sensor 28, which extends from armature 16, through left flux sensor 24, left coil 18, stator back iron 22, right coil 20, right flux sensor 26, to armature 16.

In FIG. 3, a functional block diagram of the flux squared sensor 23 is shown, comprised of sensors 24 and 26. Sensor 24 is identical in construction to sensor 26 in this embodiment. Sensor 23 has a first Hall generator subassembly 30, and a second Hall generator subassembly 32. First subassembly 30 has a first amplifier 34, a Hall generator unit or sensor 24, and a second amplifier, or transimpedance amplifier 38. Second subassembly 32 also has a first amplifier 40, a Hall generator unit or sensor 26, and a second amplifier 44.

In FIG. 3, amplifier 34 has a top positive input terminal 46, a bottom negative input terminal 48, and an output terminal 50. A connector 52 extends from top positive input terminal 46 to a terminal 54 for a reference voltage supply.

Hall generator unit 24 has a first left positive terminal 56, a second right positive terminal 58, a first left negative terminal 60, and a second right negative terminal 62. A connector 64 extends from second positive terminal 58 to amplifier output terminal 50. A connector 66 extends from amplifier negative input terminal 48, through a junction 68, through a resistor 70, through a junction 72, to ground 74. A connector 76 extends from Hall generator first negative terminal 60 to junction 68.

Amplifier 38 has a bottom positive input terminal 78, a top negative input terminal 80, an an output terminal 82. A connector 84 extends from bottom positive input terminal 78, to first left positive input terminal 56. A connector 86 extends from negative input terminal 80, through a junction 88, to the Hall generator output terminal 62. A connector 90 extends from amlifier output terminal 82 through a junction 92, through a resistor 94 to junction 88.

In FIG. 3, amplifier 40 has a top positive input terminal 96, a bottom negative input terminal 98, and an outlet terminal 100. A connector 102 extends from top positive input terminal 96 to terminal 92.

Hall generator unit 26 has a first left positive terminal 104, a second bottom positive terminal 106, a first left negative terminal 108, and a second right negative terminal 110. A connector 112 extends from second positive terminal 106 to amplifier outlet terminal 100. A connector 114 extends from amplifier negative input terminal 98, through a junction 116, through a resistor 118, and through a junction 72, which is connected to ground 74. A connector 120 extends from Hall generator first negative terminal 108 to junction 116.

Amplifier 44 has a bottom positive input terminal 122, a top negative input terminal 124, and an output terminal 126. A connector 128 extends from bottom positive input terminal 122 to first left positive input terminal 104. A connector 130 extends from negative input terminal 124, through a junction 132, to output terminal 110. A connector 134 extends from amplifier output terminal 126 through a junction 136, through a resistor 138, to junction 132. A connector 140 extends from terminal 136 to a terminal 142 for the voltage output (Vout).

FIG. 3 illustrates a function diagram of the flux squared sensor 23. Two Hall generator subassemblies 30, 32, within a common magnetic field, are cascaded. The output of the first device 30 is converted to a control current ($I_{H2}$) proportional to flux density for the second device 32. The resultant output at terminal 142 of device 32 is proportional to flux density squared, which in turn is proportional to the actuator force.

A voltage controlled current source 34 fed by a stable, constant voltage delivers constant current ($I_{H1}$) through the first Hall generator (HG1) 24. This current is given by:

$$I_{H1} = \frac{V_{ref}}{R_{S1}}.$$

The output current from first Hall generator (HG1) 24 is given by the Hall equation:

$$I_{01} = K_{HG1} * I_{H1} * B1$$

where
 $I_{01}$ = output current (A)
 $K_{HG1}$ = Hall coefficient of HG1 (A/A-Tesla)
 $I_{H1}$ = Hall current (A)
 B1 = flux density incident to HG1 (Tesla)
 * = times.

A transimpedance amplifier 38 converts this current to an output voltage ($V_{B1}$), proportional to B1 ($K_{HG1}$ and $I_{H1}$ assumed constant), given by:

$$V_{B1} = R_{F1} * I_{01}$$

This voltage drives a second voltage controlled current source 40, which insures the current delivered through a second hall device (HG2) 26 is proportional to B1. The output voltage of device 32 is given by:

$$V_{B2} = K_{HG2} * I_{H2} * B2 * R_{F2}$$

Substituting for $I_{H2}$ yields (letting Vout=$V_{B2}$):

$$\text{Vout} = \frac{K_{HG1} * K_{HG2} * V_{ref} * R_{F1} * R_{F2} * B1 * B2}{R_{S1} * R_{S2}}.$$

Make $$K' = \frac{K_{HG1} * K_{HG2} * V_{ref} * R_{F1} * R_{F2}}{R_{S1} * R_{S2}}.$$

and assume B1 = B2 = B, then:

$$\text{Vout} = K' * B^2.$$

Thus, the output voltage is proportional to flux density squared.

The advantages of actuator 10 are indicated hereafter.

First, sensor 23 provides a feedback signal which is proportional to force.

Second, sensor 23 does not require non-linear signal conditioning elements to provide an output proportional to force.

Third, sensor 23 provides an increase in force accuracy in an all-analog system as compared to prior art sensors.

Fourth, sensor 23 reduces computational overhead when used in a digital or hybrid controller.

Fifth, actuator 10 can operate in a low-quiescent power configuration without using non-linear circuit elements or algorithms.

While the invention has been described in its preferred embodiment, it is to be understood that the words which have been used are words of description rather than limitation and that changes may be made within the purview of the appended claims without departing from the true scope and spirit of the invention in its broader aspects.

For example, instead of an implementation of Hall devices of sensor 23 in the current mode as described, an implementation of Hall devices of sensor 23 in a voltage mode can be provided.

The embodiments of an invention in which an exclusive property or right is claimed are defined as follows:

1. A flux sensor for use in a flux field for sensing flux density comprising:
   a first amplifier having a first input terminal for receiving a reference voltage and having a first output terminal;
   a first Hall generator unit having a first input terminal connected to the first output terminal of the first amplifier for receiving a reference-voltage controlled current and having a first output terminal;
   a second amplifier having a first input terminal connected to the first output terminal of the first Hall generator unit and having a first output terminal for supplying an output voltage;
   a third amplifier having a first input terminal connected to the first output terminal of the second amplifier and having a first ouput terminal;
   a second Hall generator unit having a first input terminal connected to the first output terminal of the third amplifier for receiving a flux-modulated current and having a first output terminal;
   a fourth amlifier having a first input terminal connected to the first output terminal of the second Hall generator unit and having a first output terminal for supplying an output voltage.

2. The flux sensor of claim 1 including:
   an armature; and
   a stator having a back iron;
   said back iron having a first end portion with a first coil and having a second end portion with a second coil for forming a magnetic flux path with a flux field with a flux density;
   said end portions being selectively spaced from the armature.

3. The flux sensor of claim 2, wherein:
   the stator applies a force on the armature when energized, and said force is a function of a current applied to the first coil and the second coil, and said force is proportional to the square of the flux density, and said square of the flux density is proportional to the output voltage; and said output voltage provides a feedback signal for control of the applied current, whereby the applied force is a known and repeatable amount of force for an applied level of the current through the coils; and wherein
   said armature has a first face facing said stator and has a second face for facing a second stator of a second flux sensor.

4. A flux sensor for use in a flux field for sensing flux density including a first Hall generator subassembly and a second Hall generator subassembly, wherein
   the first Hall generator subassembly includes:
   a first amplifier having a first input terminal for receiving a reference voltage and having a first output terminal;
   a first Hall generator unit having a first input terminal connected to the first output terminal of the first amplifier for receiving a constant current and having a first output terminal;
   a second amplifier having a first input terminal connected to the first output terminal of the first Hall generator unit and having a first output terminal for supplying an output voltage; and wherein
   the second Hall generator subassembly includes:
   a third amplifier having a first input terminal connected to the first output terminal of the second amplifier and having a first output terminal;
   a second Hall generator unit having a first input terminal connected to the first output terminal of the third amplifier for receiving a control current and having a first output terminal;
   a fourth amplifier having a first input terminal connected to the first output terminal of the second Hall generator unit and having a first output terminal for supplying an output voltage which is proportional to the square of a value of the flux density.

5. The flux sensor of claim 4, including:
   an armature;
   a stator having a U-shaped back iron;
   said back iron having a first end portion with a first coil and having a second end portion with a second coil for forming a magnetic path with a flux field with a flux density;
   said first end portion and said second end portion having respectively a first gap and a second gap from the armature;
   said first Hall generator subassembly and said second Hall generator subassembly being respectively partly disposed in said first gap and said second gap.

* * * * *